(12) United States Patent
Chen et al.

(10) Patent No.: US 8,942,840 B2
(45) Date of Patent: Jan. 27, 2015

(54) AUTO DEVICE SKEW MANUFACTURING (71) Applicant: Taiwan Semiconductor Manufacturing Company, Ltd., Hsin-Chu (TW)

(72) Inventors: Jui-Long Chen, Taichung (TW); Hui-Yun Chao, Zhubei (TW); Chia-Tong Ho, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/743,096

(22) Filed: Jan. 16, 2013

(65) Prior Publication Data

US 2013/0131858 A1    May 23, 2013

Related U.S. Application Data (63) Continuation of application No. 12/797,392, filed on Jun. 9, 2010, now Pat. No. 8,391,999.

(51) Int. Cl.
 *G06F 19/00* (2011.01)
 *G06F 17/50* (2006.01)
 *G05B 19/418* (2006.01)

(52) U.S. Cl.
 CPC ...... *G06F 17/5068* (2013.01); *G05B 19/41865* (2013.01); *G05B 2219/32096* (2013.01)
 USPC .......................................... 700/110; 700/121

(58) Field of Classification Search
 USPC ............... 700/47, 51, 55, 104, 108–110, 121; 438/14; 250/31
 See application file for complete search history.

(56) References Cited

U.S. PATENT DOCUMENTS

| 4,368,510 | A | | 1/1983 | Anderson |
| 6,000,830 | A | * | 12/1999 | Asano et al. ................... 700/121 |
| 6,306,669 | B1 | * | 10/2001 | Yano et al. ....................... 438/14 |
| 6,415,193 | B1 | * | 7/2002 | Betawar et al. ................. 700/97 |
| 6,424,881 | B1 | | 7/2002 | Steffan et al. |
| 6,470,230 | B1 | * | 10/2002 | Toprac et al. .................. 700/121 |
| 6,486,036 | B1 | * | 11/2002 | Miethke et al. ............... 438/401 |
| 6,496,747 | B1 | * | 12/2002 | Suzuki .......................... 700/102 |
| 6,748,288 | B2 | * | 6/2004 | Su et al. ......................... 700/108 |
| 6,787,376 | B1 | * | 9/2004 | Grover et al. .................... 438/14 |
| 6,787,573 | B2 | * | 9/2004 | Nottet ............................ 514/708 |
| 7,047,101 | B1 | | 5/2006 | Young et al. |
| 7,283,882 | B1 | * | 10/2007 | Bransky et al. ................. 700/96 |
| 7,324,866 | B2 | * | 1/2008 | Imai .............................. 700/121 |
| 7,337,019 | B2 | | 2/2008 | Reiss et al. |
| 7,617,015 | B2 | * | 11/2009 | Steinbach et al. .............. 700/97 |
| 7,906,632 | B2 | * | 3/2011 | Nusser .......................... 534/696 |
| 7,934,175 | B2 | | 4/2011 | Kotani et al. |
| 7,994,623 | B2 | * | 8/2011 | Nonomura et al. ........... 257/686 |
| 2002/0038161 | A1 | | 3/2002 | Ziger |
| 2003/0204281 | A1 | * | 10/2003 | Su et al. ........................ 700/108 |
| 2008/0065696 | A1 | | 3/2008 | Ahmed et al. |
| 2008/0147228 | A1 | * | 6/2008 | Fenner et al. ................. 700/121 |
| 2008/0250381 | A1 | | 10/2008 | Kotani et al. |
| 2011/0307088 | A1 | | 12/2011 | Chen et al. |

* cited by examiner

*Primary Examiner* — Kidest Bahta
(74) *Attorney, Agent, or Firm* — Slater & Matsil, L.L.P.

(57) ABSTRACT

A system and method for manufacturing semiconductor devices is disclosed. An embodiment comprises using desired device parameters to choose an initial manufacturing recipe. Once chosen, the initial manufacturing recipe may be modified by determining and applying an offset adjustment based on previous manufacturing to tune the recipes for the particular equipment to be utilized in the manufacturing process.

20 Claims, 6 Drawing Sheets

AUTO DEVICE SKEW MANUFACTURING

This application is a continuation of U.S. patent application Ser. No. 12/797,392, filed on Jun. 9, 2010, and entitled "Auto Device Skew Manufacturing," which application is hereby incorporated herein by reference.

TECHNICAL FIELD

The present invention relates generally to a system and method for manufacturing semiconductor devices and, more particularly, to a system and method for automatically adjusting for skew during the manufacturing of a semiconductor device.

BACKGROUND

Generally, semiconductor manufacturers such as semiconductor foundries (which accept manufacturing orders from many customers with different designs) perform new tape outs (NTOs) on a regular basis, as new designs and/or new process nodes (e.g., 90 nm, 65 nm, etc.) are introduced. In most of these NTOs for designs greater than 65 nm, a single process condition, such as the critical dimension of the active area can effectively control the manufacturing such that, when that single critical dimension is met within a certain sensitivity, the remaining process conditions will also meet the specifications required for the devices. Given such a simple, single-stage sensitivity of process nodes that are 65 nm or greater, engineers would be able to take a customer's specifications together with the single stage process conditions and manually map them to assign a recipe, or specific operating specifications, for the manufacturing of the desired design at the desired process node.

However, when the processes and designs are scaled down to nodes smaller than 65 nm, the single-stage sensitivity is not as effective. At such sizes, each of the process variables or stages interact with the other stages, such that no single stage may control the desired parameters as in the larger nodes. Instead, unintended consequences could occur if decisions are based on a single parameter instead of all of the parameters.

Additionally, having human operators and engineers making manual decisions about which process recipe to use also runs the risk of human error. Such errors can be time consuming and costly to analyze and correct and, as such, can lead to long cycle times while these errors are corrected. These long cycle times can slow down and delay the eventual manufacturing of the desired device.

SUMMARY

These and other problems are generally solved or circumvented, and technical advantages are generally achieved, by preferred embodiments which automatically determine an initial recipe and then apply an offset to the initial recipe.

In accordance with an embodiment, a method for manufacturing a semiconductor device comprises receiving parameters for the semiconductor device and applying an initial recipe algorithm to select an initial recipe based at least in part on the parameters for the semiconductor device. A device offset is determined, and the device offset is applied to the initial recipe to obtain a device tuned recipe. The semiconductor device is manufactured utilizing at least in part the device tuned recipe.

In accordance with another embodiment, a method for manufacturing a semiconductor device comprises receiving device parameters for the semiconductor device and automatically choosing a main recipe based at least in part on the device parameters and a main recipe algorithm, the main recipe providing at least one predicted device parameter. Historical data is received for at least one tool which will be used to manufacture the semiconductor device, and an offset between the historical data and the predicted device parameter is determined. The offset is applied to the main recipe to obtain a device tuned recipe, and the device tuned recipe is applied to the at least one tool. The semiconductor device is manufactured using at least in part the device tuned recipe.

In accordance with yet another embodiment, a system for manufacturing a semiconductor device comprises a receiving module to receive device parameters and a main recipe algorithm module coupled to the output of the receiving module to receive the device parameters and output a main recipe. A compensation module is coupled to the output of the main recipe algorithm module to apply a compensation variable to the main recipe and output a device tuned recipe. A process control module is coupled to the output of the compensation module to receive the device tuned recipe, and the output control module is adapted to control a semiconductor manufacturing process tool using the device tuned recipe.

In accordance with yet another embodiment, a system for manufacturing a semiconductor device comprising a first module to receive device parameters and output a main recipe, wherein the device parameters are parameters of devices to be manufactured is provided. A second module is coupled to the first module to apply a compensation variable to the main recipe to form a control recipe, the control recipe controlling a semiconductor manufacturing process tool.

In accordance with yet another embodiment a semiconductor manufacturing system comprising a first semiconductor manufacturing tool is provided. A first semiconductor manufacturing controller is coupled to the first semiconductor manufacturing tool, the first semiconductor manufacturing controller comprising a main recipe algorithm module to receive device parameters of a device to be manufactured by the first semiconductor manufacturing tool and to output a main recipe and a compensation module coupled to the output of the main recipe algorithm module to apply a compensation variable to the main recipe and output a device tuned recipe to be used to control the first semiconductor manufacturing tool.

In accordance with yet another embodiment a semiconductor device recipe system comprising a first module configured to determine a first device recipe from device parameters is provided. A second module is coupled to the first module and configured to receive the first device recipe and tune the device recipe based on a compensation factor to generate a tuned device recipe to control a semiconductor manufacturing tool.

An advantage of an embodiment is an increase in the success rate for new tape out runs in the manufacturing lines of semiconductor devices. Such an increase in success rates also reduces wasted time and costs associated with unsuccessful runs that require costly and time consuming adjustments.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways, and do not limit the scope of the embodiments.

Embodiments will be described with respect to a specific context, namely an automatic semiconductor recipe algorithm accompanied with an automatic offset. The embodiments may also be applied, however, to other manufacturing decisions.

Figure 1:
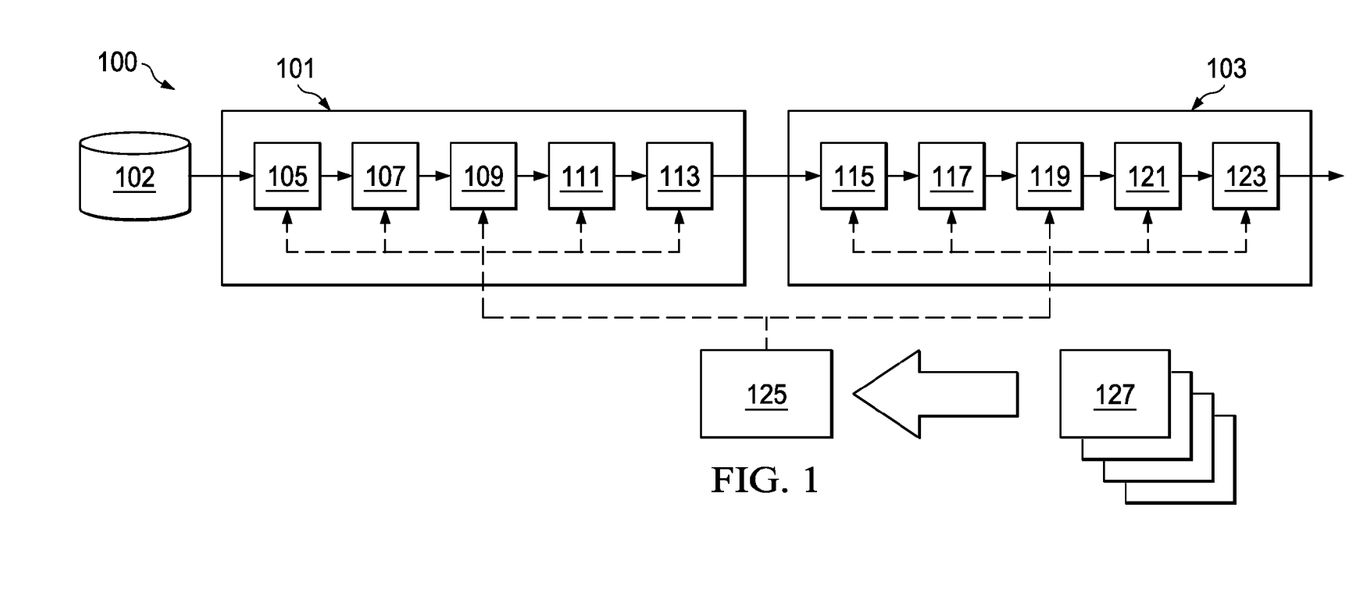
FIG. 1 illustrates a semiconductor manufacturing line in accordance with an embodiment.

With reference now to FIG. 1, there is shown a semiconductor manufacturing line 100. The semiconductor manufacturing line 100 is utilized to take, e.g., an ingot of crystal silicon 102 or a semiconductor-on-insulator substrate and to process these substrates to at least partially form semiconductor devices (not shown). The semiconductor manufacturing line 100 may be divided into a front end of line (FEOL) section 101 and a back end of line (BEOL) section 103 in order to form and connect devices to be formed on the crystal silicon 102.

The FEOL section 101 may be utilized to form devices such as transistors (not shown) on and within the crystal silicon 102. The FEOL section 101 may include such processes as implantations of dopants, oxidations, material depositions, material etchings, diffusings, ovens for rapid thermal anneals, chemical mechanical polishings, combinations of these, and the like. As such, the FEOL section 101 may include such tools as ion implanters 105, thermal oxidizers 107, deposition chambers 109, etching chambers 111, chemical mechanical polishers 113, and the like.

In operation, the crystal silicon 102 may be moved through the FEOL section 101 in a particular order of tools (not necessarily in the order illustrated in FIG. 1) in order to form semiconductor devices on the crystal silicon 102. For example, one such series of processes may include, among other process steps, an anti-punch through (APT) implantation, followed by a threshold voltage implantation, the formation of a gate oxide, a deposition of polysilicon, a lightly doped drain implantation, a rapid thermal anneal, and the formation of spacers. The crystal silicon 102 may be moved from tool to tool (e.g., from the ion implanters 105 to the thermal oxidizers 107) in order to perform each of these processes as desired to form the semiconductor devices on the crystal silicon 102.

Once the semiconductor devices have been formed on the crystal silicon 102, the crystal silicon 102 may be transported to the BEOL section 103 in order to connect the semiconductor devices together and to form an integrated circuit. The BEOL section 103 may include such processes as material depositions, material etchings, sputterings, platings, chemical mechanical polishings, combinations of these, and the like. As such, the BEOL line section 103 may include such tools as deposition chambers 115, etching chambers 117, sputtering chambers 119, plating chambers 121, chemical mechanical polishers 123, and the like.

The BEOL section 103 forms vias and interconnects through processes such as etch stop layer formations, inter-layer dielectric depositions, etchings, deposition, plating, chemical mechanical polishing, and the like to form the various connections between the semiconductor devices. For example, one such series of processes may include, among other process steps, the deposition of an etch stop layer, the deposition of an inter-layer dielectric, the patterning of the inter-layer dielectric using the deposition of a seed layer, the plating of a conductor into the inter-layer dielectric, and the chemical mechanical polishing of the plated conductor (e.g., a dual damascene process). As with the FEOL section 101, the crystal silicon 102 may be moved from tool to tool in order to perform each of these processes as desired to connect the semiconductor devices on the crystal silicon 102 into an integrated circuit.

Additionally, as one of ordinary skill in the art will recognize, the FEOL section 101 and the BEOL section 103 are not the only sections that may be utilized to complete the manufacturing of the semiconductor devices. Further sections, such as a packaging section, may also be included within the manufacturing line 100, and these sections may also have manufacturing tools and device tuned recipes 127. These additional sections are fully intended to be included within the scope of the present embodiments.

The semiconductor manufacturing line 100 also includes a process controller 125 in order to control the various operating parameters of the individual tools involved in manufacturing the semiconductor devices. The process controller 125 may be a single controller (as illustrated in FIG. 1), or may be a series of controllers that each control one or more of the individual tools for the individual processes (e.g., a separate controller for each of the tools in the semiconductor manufacturing line 100). The process controller 125 may be a computer which is programmed, either through hardware or software, to control the operating parameters involved with each tool.

As an example only, for an anti-punch through (APT) implantation, the process controller 125 may control the ion implanter 105 by controlling such operating parameters as a desired ion implantation dosage, a desired ion beam current, a current to accelerator electrodes, positioning of a wafer handling unit, and the like. By controlling these operating parameters, the process controller 125 may control the desired characteristics of the final product, such as the saturation current, Isat.

To control the various operating parameters utilized by the semiconductor manufacturing line 100, the process controller 125 may receive device tuned recipes 127, or operating instructions, from the operators. The device tuned recipes 127 detail in engineering precision each of the operating parameters that are desired for each process used in the manufacture of the semiconductor devices. For example, the device tuned recipes 127 may include the process conditions for the APT implantation, such as the ion implantation dosage, a desired ion beam current, a current to accelerator electrodes, positioning of a wafer handling unit 115, and the like. Each of the various processes and, as such, the various tools utilized to perform those processes, has a unique set of device tuned recipes 127 that may be determined for each tool in order to achieve the desired device characteristics.

Figure 2:
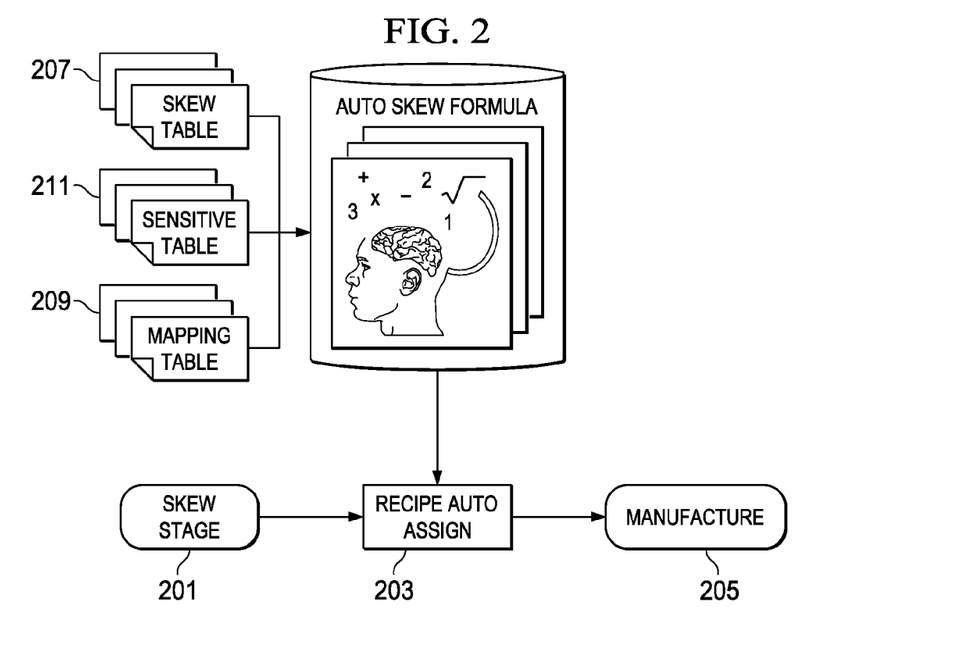
FIG. 2 illustrates a process for choosing and applying a recipe for a new tape out in accordance with an embodiment.

FIG. 2 illustrates a process for determining the device tuned recipe 127 for a new tape out (NTO) and using that device tuned recipe 127 within the manufacturing line 100 for the NTO. As shown along the bottom of FIG. 2, the process steps that result in the ultimate manufacturing of an NTO pilot start with a Skew Stage 201, then progresses to a Recipe Auto Assign Stage 203, which then progresses to the Manufacture Stage 205. Each of these steps will be discussed in the following paragraphs.

In the Skew Stage 201, desired parameters for the to-be manufactured semiconductor device are initially chosen or received by the manufacturer. These desired parameters may be any device parameters, and may include such parameters as Isat for various devices within the to-be manufactured semiconductor device, critical dimensions (CD), gate oxide thickness (GOX THK), copper thickness (Cu THK), combinations of these, and the like. The desired parameters may be, e.g., chosen by the manufacturers or else received from customers as specifications.

A convenient form for the desired parameters is a skew table 207, such as the one presented in Table 1.

TABLE 1

(Skew Table)

|   |   | Condition | #1 | #2 | #3 |
|---|---|---|---|---|---|
| Vt_N | F | STD − y1% (dose) |   | V |   |
| 191 | T | STD | V |   |   |
|   | S | STD + y2% (dose) |   |   | V |
| HVTN | S | STD | V |   | V |
| 128 | F | Fast corner |   | V |   |
| Vt_P | F | STD − z1% (dose) |   | V |   |
| 117(192) | T | STD | V |   |   |
|   | S | STD + z2% (dose) |   |   | V |
| nPKT | F | STD − y1% (dose) |   | V |   |
| 114 | T | STD | V |   |   |
|   | S | STD + y2% (dose) |   |   | V |
| pPKT | F | STD − z1% (dose) |   |   |   |
| 113 | T | STD | V |   |   |
|   | S | STD + z2% (dose) |   |   | V |
| IO_N | f | STD − y1% (dose) |   | V |   |
| 193 | t | STD | V |   |   |
|   | s | STD + y2% (dose) |   |   | V |
| GOAL |   | Isat_N4 | 0% | 20% | −20% |
|   |   | Isat_P4 | 0% | 18% | −19% |
|   |   | Isat_N4H | 0% | 20% | −20% |
|   |   | Isat_P4H | 0% | 18% | −19% |
|   |   | Isat_N4L | 0% | 20% | −20% |
|   |   | Isat_P4L | 0% | 18% | −19% |
|   |   | Isat_N42 (IO) | 0% | 7% | −7% |
|   |   | Isat_P42 (IO) | 0% | 9% | −9% |

As can be seen in Table 1, various parameters, such as the threshold voltage for the N-MOS transistors (Vt_N), the threshold voltage of the High Vt nMOS transistors (HVTN), the threshold voltage for the P-MOS transistors (Vt_P), the nMOS PKT IMP (nPKT), the pMOS PKT IMIP (pPKT), and the nMOS IO transistors (IO_N) are given a standard Isat condition ("T"), standard setting (STD) as well as a fast Isat condition ("F"), above standard setting (e.g., STD+y2%) and a slow Isat condition ("S"), below standard setting (e.g., STD−y1%). These separate settings may be chosen to obtain different desired Isats (see the bottom of the skew table 207 to the right of GOAL) for different wafers to be manufactured (e.g., #1 wafer, #2 wafer, and #3 wafer at the top of the skew table 207).

Figure 3:
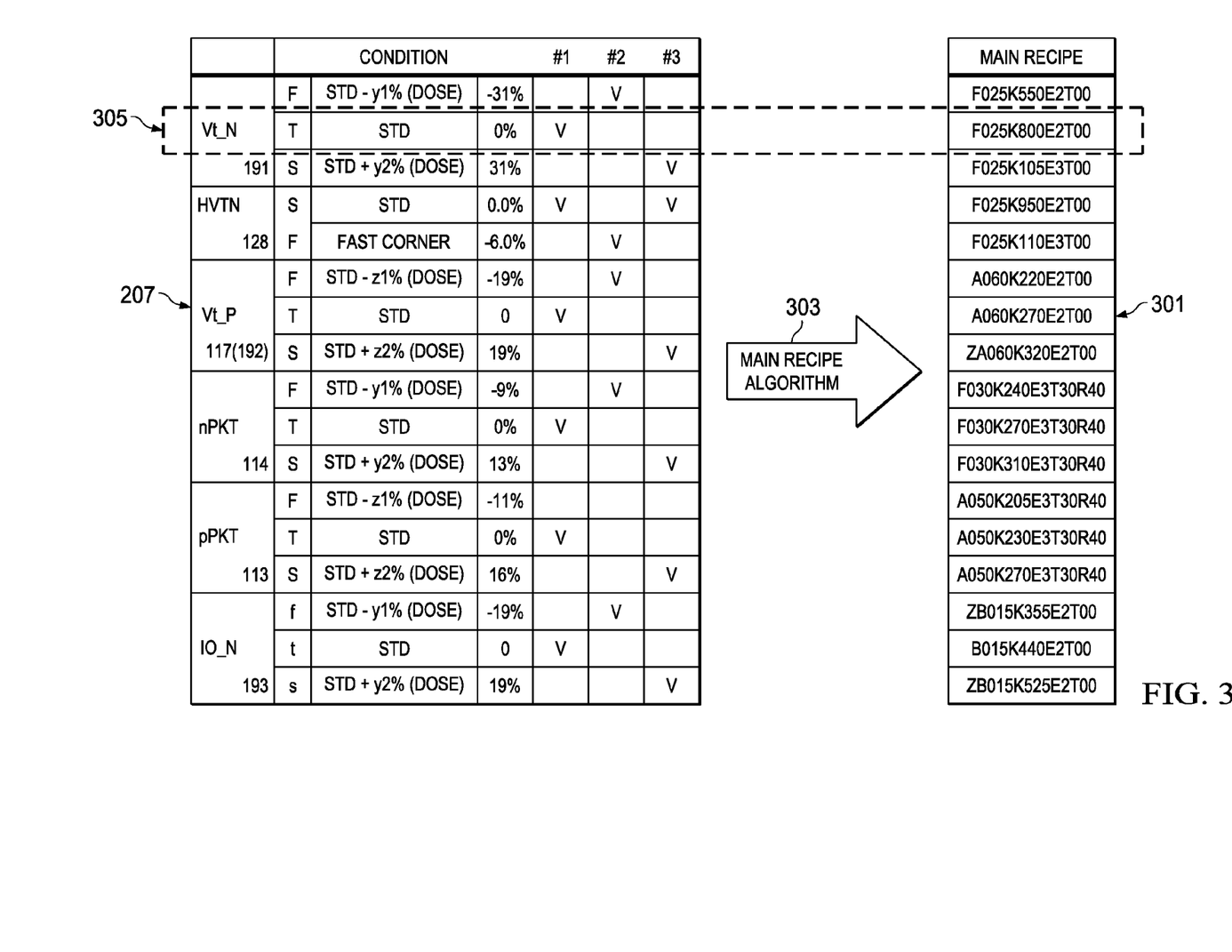
FIG. 3 illustrates an application of a main recipe algorithm to determine a main recipe in accordance with an embodiment.

FIG. 3 illustrates that, once the device parameters are chosen or received, a main recipe algorithm 303 may be utilized to automatically choose a main recipe 301 for those device parameters. In an embodiment the main recipe algorithm 303 may include a mapping table 209 which, as illustrated in FIG. 2, may be combined with the skew table 207 as one part of an auto skew formula. The mapping table 209 may be a rule based table in which one or more desired conditions are linked to a particular device tuned recipe 127 when those conditions are chosen. The particular relationships relating the rule based table to the device tuned recipes 127 may be determined from a statistical approach to experimental design such as Design of Experiments (DOE), the knowledge of the engineers, combinations of these, and the like. For example, as illustrated in FIG. 3 by the dashed line 305, for the Vt_N stage, a standard (STD) recipe combined with the main recipe algorithm 303 may yield a particular main recipe 301 (identified in FIG. 3 as recipe F025K800E2T00).

However, as one of ordinary skill in the art will recognize, the mapping table 209 is merely one such main recipe algorithm 303 that may be used to automatically assign a main recipe 301 to the desired process conditions from, e.g., the skew table 207. Any other suitable main recipe algorithm 303, such as using a critical dimension or thickness to choose the main recipe, may alternatively be utilized to automatically determine the main recipe 301. These alternatives and any other suitable alternatives may also be utilized and are fully intended to be within the scope of these embodiments.

Figure 4:
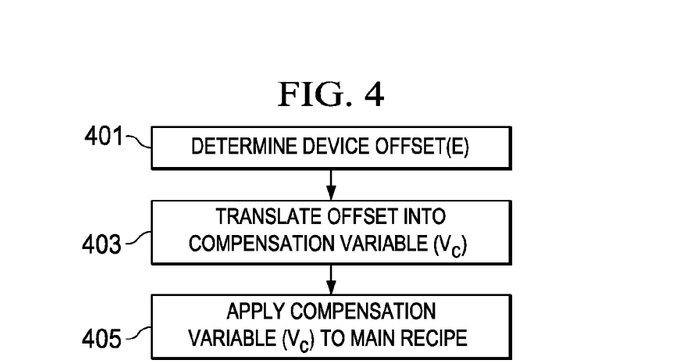
FIG. 4 illustrates a method to apply a device offset to the main recipe in accordance with an embodiment.

FIG. 4 illustrates that, once a main recipe 301 has been chosen by the main recipe algorithm 303 using, e.g., the skew table 207 and the mapping table 209, the main recipe 301 may be modified in order to tune the device parameters formed by the main recipe 301 with a tool specific device offset E. For example, and as further detailed in the following paragraphs, one such device parameter that may be chosen is the Isat for a transistor (not shown) within the semiconductor device. However, any other suitable device parameter may be chosen either in addition to or alternatively to the Isat, and each of these device parameters may be tuned separately utilizing the processes described in the following embodiments.

As illustrated in FIG. 4, a device offset E for the chosen device parameter may be determined empirically by way of an estimation formula in step 401. Once the device offset E is determined, the device offset E may be translated into a compensation variable $V_c$ in step 403. Finally, the compensation variable $V_c$ may be added to the main recipe 301 in step 405 to form the device tuned recipes 127 to be input into the process controller 125 (see FIG. 1). Each of these steps is discussed in further detail in the following paragraphs.

To determine the device offset E for a desired parameter in step 401, a long term, empirically derived trend of that parameter $Y_{LT}$ may be subtracted from the parameter's predicted value Y according to the main recipe 303, as shown in Equation 1.

$$E = Y - Y_{LT} \qquad \text{Eq. 7}$$

Where:
E=Device Offset
Y=Predicted Parameter Result (from main recipe 301)
$Y_{LT}$=Long Term Parameter Results (determined empirically from the tools used)

Because the long term parameter results $Y_{LT}$ are related to the tools, and the predicted parameter result Y is related to the main recipes 301, this device offset E calculation provides a recipe-to-tool offset and tells an operator how far away from the main recipe 301 the manufacturing tools are operating.

Additionally, the device parameters (Y and $Y_{LT}$) may each be viewed as the summed contributions from all of the various in-line parameters that affect the final parameter, as illustrated in Equation 2, which, as an example, uses three separate in-line parameters.

$$Y = a_1 x_1 + a_2 x_2 + a_3 x_3 + \in \quad \text{Eq. 2}$$

Where:
$x_1, x_2, x_3$=In-Line Parameters
$a_1, a_2, a_3$=Regression Coefficients
$\in$=Equation Error/Noise Term Accordingly, from Equation 1 and Equation 2, the initial device offset E can be found from Equation 3, illustrated below.

$$E = Y - Y_{LT} = a_1(x_1 - x_{1LT}) + a_2(x_2 - x_{2LT}) + a_3(x_3 - x_{3LT}) \quad \text{Eq. 3}$$

Where:
$x_1$=Predicted Device Parameter for In-Line Parameter 1
$x_{1LT}$=Long Term Device Parameter for In-Line Parameter 1
$x_2$=Current Device Parameter for In-Line Parameter 2
$x_{2LT}$=Long Term Device Parameter for In-Line Parameter 2
$x_3$=Current Device Parameter for In-Line Parameter 3
$x_{3LT}$=Long Term Device Parameter for In-Line Parameter 3
$a_1, a_2, a_3$=Regression Coefficients As an example only, if Isat is chosen as the device parameter to be tuned, an active area critical dimension (ODCD), an oxide thickness (Tox), a polysilicon critical dimension (POCD), and a silicon germanium bias (SiGe) may be in-line parameters that affect the final Isat for the desired device. Given these parameters, equation 4 may be set up to find the device offset E.

$$E = Y - Y_{LT} = a_1(ODCD - ODCD_{LT}) + a_2(Tox - Tox_{LT}) + a_3(POCD - POCD_{LT}) + a_4(SiGe - SiGe_{LT}) \quad \text{Eq. 4}$$

The regression coefficients $a_1$, $a_2$, and $a_3$ may be found using a multiple regression model from previous runs of the tools and Equation 2 (see above), such as shown in Equation 5.

$$Y_i = a_1 x_{i1} + a_2 x_{i2} + \ldots + a_k x_{i,k} + \in_i, \quad \text{Eq. 5}$$

Where: i=1, 2, ..., n
Equation 5 can be rewritten into Equation 6.

$$\begin{bmatrix} Y_1 \\ Y_2 \\ \vdots \\ Y_n \end{bmatrix} = \begin{bmatrix} 1 & x_{11} & \ldots & x_{1k} \\ 1 & x_{21} & \ldots & x_{2k} \\ \vdots & \vdots & \vdots & \vdots \\ 1 & x_{n1} & \ldots & x_{nk} \end{bmatrix} \begin{bmatrix} a_1 \\ a_2 \\ \vdots \\ a_k \end{bmatrix} + \begin{bmatrix} \varepsilon_1 \\ \varepsilon_2 \\ \vdots \\ \varepsilon_n \end{bmatrix} \quad \text{Eq. 6}$$

From Equation 6 and the empirical, historical data, a multiple regression model (MRM) may be used to interpolate the appropriate coefficients for the derivation of the device offset E.

Figure 5:
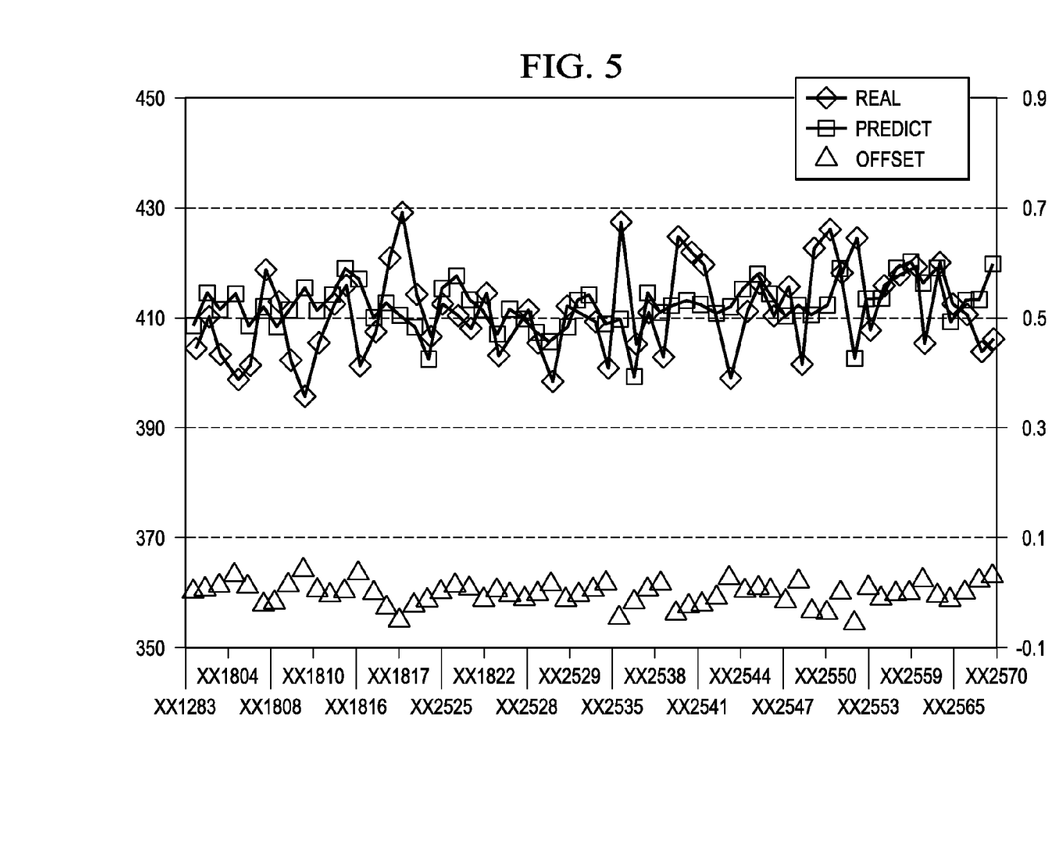
FIG. 5 illustrates empirical test run data to determine a device offset in accordance with an embodiment.

FIG. 5 illustrates an example of empirical test run data for use in the Isat example previously discussed and continued in this paragraph. Given this data and Equation 6, the coefficients for Equation 4 may be calculated using the MRM regression analysis. Once determined, the coefficients may be entered into Equation 4 to arrive at Equation 7.

$$E_{Isat\_p} = 390 + 0.1[ODCD] - 2.05[Tox] - 1.35[POCD] - 1.5[SiGe] \quad \text{Eq. 7}$$

As one of ordinary skill in the art will recognize, the MRM analysis presented above is but one illustrative method to obtain the regression coefficients $a_1, a_2, a_3$. Any other suitable analysis, such as a multivariate analysis of variance (MANOVA) or a partial least squares regression (PLS) may alternatively be used to analyze the historical data of the manufacturing tools. All of these methods are fully intended to be included within the scope of the present embodiments.

Additionally, while the MRM analysis may be performed each time a new device tuned recipe 127 may be needed, a single MRM analysis may be performed and then stored in order to use the same coefficients on multiple runs without having to recalculate the regression coefficients. For example, once the regression coefficients have been determined, they may be placed into a look-up table, such as the sensitivity table 211 (see FIG. 2) illustrated in Table 3 below.

TABLE 3

| Stage | Unit | Core_N | Core_P |
| --- | --- | --- | --- |
| OD | 1 nm | 0.20% | 0.10% |
| GOX | 1 A | 2.65% | 2.05% |
| PO | 1 nm | 1.55% | 1.35% |
| SiGe | 1 nm |  | 1.50% |
| LDD | 1E12 | 0.80% | 0.75% |
| SW | 1 nm | 1.45% | 0.75% |

Using the sensitivity table 211, the same regression coefficients may be used for different device tuned recipes 127 without requiring a new analysis every time.

Returning to the process outlined in FIG. 4, once the main recipe 301 has been chosen (see FIG. 3) and the device offset E has been calculated (see, e.g., Equation 7) in step 401, the device offset E may be translated into a compensation variable $V_c$ in step 403. The compensation variable $V_c$ may be a process variable that would directly translate into an adjustment of the chosen offset parameters (e.g., Isat in one presented embodiment). As such, the compensation variable $V_c$ may include such variables as dosages, thicknesses, or the like, in order to compensate the main recipe 301 for the particular tools being used.

Figure 6:
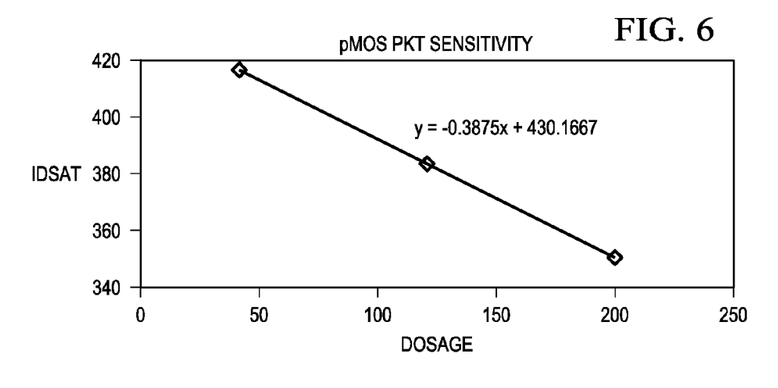
FIG. 6 illustrates an empirical translation of a device offset to a compensation variable in accordance with an embodiment.

In the Isat example discussed above and continued here, the compensation variable $V_c$ may be a compensated dosage for an ion implantation. For example, if a device offset E of 10 is determined from Equation 7, the device offset E may be translated into a machine specific dosage offset using, e.g., an IMP dosage to device offset E coefficient. One such IMP dosage to device offset E coefficient is illustrated in FIG. 6, which illustrates that, for one particular tool, a device offset E of 10 would translate into a compensation dosage offset of 10/−0.3875, or −26.

However, as one of ordinary skill in the art will recognize, such a dosage to device coefficient is not the only way to determine the compensation variable $V_c$ from the device offset E. In another illustrative embodiment, the compensated dosage may be calculated by Equation 8 below.

$$\text{Compensation Variable} = \frac{E}{IMP\ \text{Sensitivity}} \quad \text{Eq. 8}$$

Where: E=Device Offset (determined from Equation 4 above)
IMP Sensitivity=Sensitivity Coefficient The IMP sensitivity may be a relationship between the dosage to the device coefficient. Such a relationship may be determined empirically, and may be as simple as the linear relationship as illustrated above with respect to FIG. 6. However, the IMP Sensitivity may alternatively be any suitable relationship that helps to relate the compensation variable $V_c$ to the device offset E.

In step 405, once the compensation variable $V_c$ has been determined, the compensation variable may be applied to the main recipe 301. In an embodiment, this application may be performed through a suitable equation, such as Equation 9 below.

$$\text{Device Tuned Recipe}=\text{Main Recipe}+\text{Compensation Variable} \quad \text{Eq. 9}$$

By adding the compensation variable $V_c$ to the main recipe 301, the device tuned recipe 127 takes into account the variation between the parameters predicted by the main recipe 301 and the tool specific variations determined by the device offset E.

Additionally, there may be occasions where a paucity of available data may cause the MRM analysis to produce coefficients that may be less accurate than desired for the calculation of E in Equation 1. In such a circumstance, a learning ratio η may optionally be utilized for covering the risk that may arise through any over-compensation of the device offset E because of a lack of data, as illustrated in Equation 10.

$$E=\eta(Y-Y_{LT}) \quad \text{Eq. 10}$$

For example, if there is not enough data to obtain an MRM analysis with a desired accuracy, the learning ratio η may be used to reduce the calculated device offset E and thereby limit any over-compensation that may arise because of the inaccuracies from the MRM analysis. Such a learning ratio η may range from 0 to 1, with values closer to 1 being used when the MRM analysis is known to have a high accuracy.

In step 405, once a main recipe 301 has been automatically chosen, and the compensating offset has been applied, the device tuned recipes 127 may be input into the various tools of the manufacturing line 100. The inputting may be performed by either inputting one or more of the device tuned recipes 127 (automatically determined and offset compensated) into the process controller 125 (or process controllers) of the manufacturing line 100. These device tuned recipes 127, through the process controller 125, may then be utilized to set the operating parameters of the various manufacturing tools (e.g., the ion implanters 105, thermal oxidizers 107, deposition chambers 109, etc.). Once a crystal silicon 102 has progressed through the FEOL region 101 and BEOL region 103, and other regions that may also be included (e.g., packaging), the crystal silicon 102 will have been formed into a working semiconductor device ready for consumer use.

Figure 7:
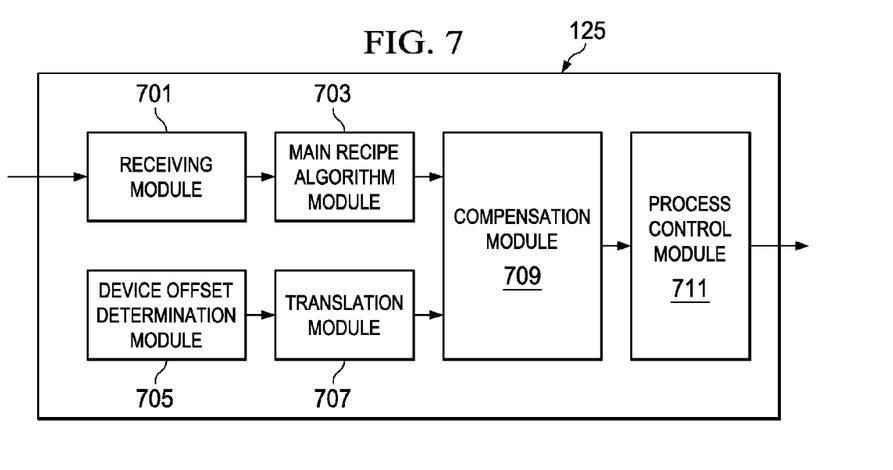
FIG. 7 illustrates a process controller in accordance with an embodiment.

FIG. 7 illustrates an alternative embodiment to determining the device tuned recipe 127 outside of the process controller 125 and then inputting the device tuned recipe 127 into the process controller 125. In this alternative embodiment, the device tuned recipes 127 are chosen and the device offset E is determined and applied within the process controller 125 itself. As such, the process controller 125 may contain a receiving module 701 to receive the desired parameters (e.g., skew table 207). The process controller 125 may then send the desired parameters to a main recipe algorithm module 703 in order to choose a main recipe 301 (see FIG. 3 above) using, e.g., one of the methods described above with respect to FIG. 3.

The process controller 125 may also have a device offset determination module 705 in order to determine the device offset E using, for example, a method such as the one described above with respect to Equations 1-5. Once the device offset E has been determined by the device offset determination module 705, the device offset E may be sent to a translation module 707, which may translate the device offset E into a suitable compensation variable $V_c$ using a suitable method such as the one described above with respect to FIG. 6 or Equation 8. The compensation variable $V_c$ and the main recipe 301 may then be combined in a compensation module 709 to obtain the device tuned recipes 127 before being stored or utilized in a process control module 711 for use by the process controller 125 in the control of the individual tools of the manufacturing line 100.

Figure 8:
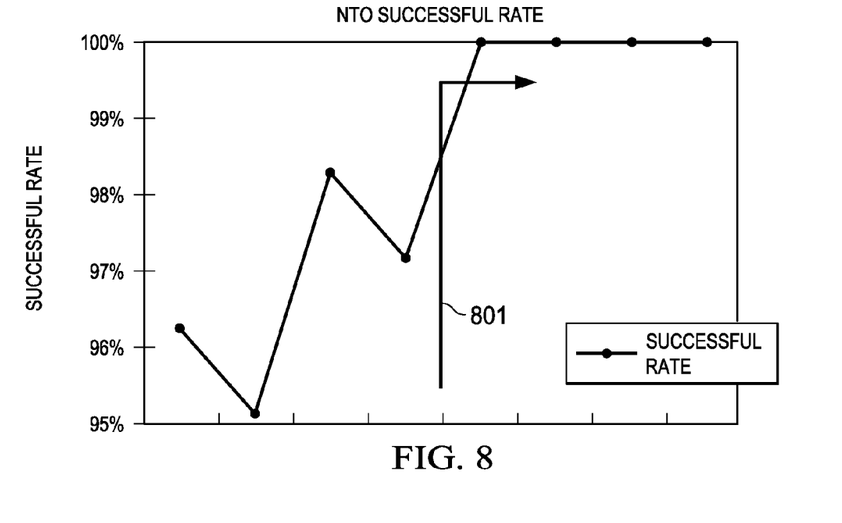
FIG. 8 illustrates empirically one of the benefits of embodiments.

FIG. 8 illustrates one of the many benefits that a manufacturer using the above methods may realize with respect to NTO runs. As illustrated, FIG. 8 shows the success rate of various NTO runs both before (to the left of the graph) and after (to the right of the device tuning line, represented by line 801). Once the described method has been applied, a success rate of 100% may consistently be reached for NTO runs, thereby reducing wasted time and costs associated with unsuccessful runs that require costly and time consuming adjustments.

Additionally, while the above described process embodiments have focused on a FEOL region 101 using ion implantation dopants (with offsets being implemented through an adjustment of the dopant concentration), the embodiments are not limited to such. Other embodiments may include other process steps using device tuned recipes 127 that have been similarly offset.

Figure 9:
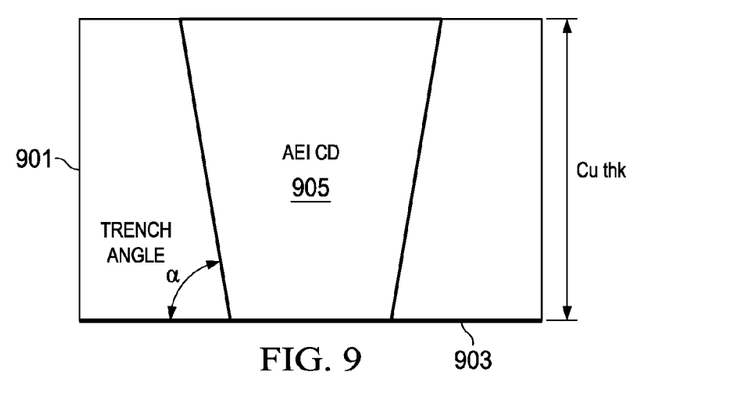
FIG. 9 illustrates the manufacture of a back end of line structure in accordance with an embodiment.

FIG. 9 illustrates one such embodiment that illustrates part of a process in the BEOL region 103: the formation of a copper interconnect. FIG. 9 illustrates a point in the process whereby a dielectric layer 901 is formed over a substrate 903, a trench is formed within the dielectric layer 901, the trench is overfilled with a conductor 905 and the overfilled conductor is planarized with respect to the dielectric layer 901. In such an embodiment the process variables may include the critical dimension of the conductor 905, the thickness of the conductor 905, and the angle α of the trench. Using these variables, the regression coefficients may be calculated as described above with respect to Equations 5-6, an offset of, e.g., a conductor critical dimension variable may be applied, and the interconnect may be manufactured using the offset. Such a manufacturing may improve the resistance of the interconnect by 1% and lower the sigma from 0.0039 to 0.0027, thereby giving an improved NTO pilot run.

Although the present invention and its advantages have been described in detail, it should be understood that various changes, substitutions and alterations can be made herein without departing from the spirit and scope of the invention as defined by the appended claims. For example, different variables may be offset for different sections of the manufacturing line, or different optimization regression analyses may be performed in order to find the coefficients for the device offset equation.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

What is claimed is:

1. A system for manufacturing a semiconductor device, the system comprising
 a first module to receive device parameters and output a main recipe based at least in part on the device parameters, wherein the device parameters are parameters of devices to be manufactured;
 a second module coupled to the first module to apply a compensation variable to the main recipe to form a control recipe, the control recipe controlling a semiconductor manufacturing process tool;
 a third module coupled to the second module to receive a device offset and send the compensation variable to the second module; and
 a fourth module coupled to the third module to determine the device offset and send the device offset to the third module, wherein the device offset is a variable for a process to be performed on the devices to be manufactured.

2. The system of claim 1, further comprising a third module coupled to the first module to forward the device parameters to the first module.

3. The system of claim 1, further comprising a control module coupled to an output of the second module to receive the control recipe and control the semiconductor manufacturing process tool.

4. The system of claim 1, wherein the device offset is a look-up table.

5. The system of claim 1, wherein the semiconductor manufacturing process tool is an ion implantation unit.

6. A semiconductor manufacturing system comprising:
 a first semiconductor manufacturing tool;
 a device offset determination module to determine a device variable offset and output the device variable offset; and
 a first semiconductor manufacturing controller coupled to the first semiconductor manufacturing tool, the first semiconductor manufacturing controller comprising:
  a main recipe algorithm module to receive device parameters of a device to be manufactured by the first semiconductor manufacturing tool and to output a main recipe based at least in part on the device parameters of the device to be manufactured; and
  a compensation module coupled to the output of the main recipe algorithm module to apply a compensation variable to the main recipe and output a device tuned recipe to be used to control the first semiconductor manufacturing tool, wherein the compensation variable is at least in part dependent upon the device variable offset.

7. The semiconductor manufacturing system of claim 6, wherein the first semiconductor manufacturing controller further comprises a receiving module with an output coupled to the main recipe algorithm module to forward the device parameters to the main recipe algorithm module.

8. The semiconductor manufacturing system of claim 6, wherein the first semiconductor manufacturing controller further comprises a process control module coupled to an output of the compensation module to receive the device tuned recipe and control the first semiconductor manufacturing tool based on the device tuned recipe.

9. The semiconductor manufacturing system of claim 6, further comprising a second semiconductor manufacturing tool coupled to the first semiconductor manufacturing controller.

10. The semiconductor manufacturing system of claim 6, further comprising a translation module coupled to the device offset determination module to receive the device offset and output the compensation variable to the compensation module.

11. The semiconductor manufacturing system of claim 6, wherein the device offset is a look-up table.

12. A semiconductor device recipe system comprising:
 a first module configured to determine a first device recipe from device parameters, wherein the device parameters are parameters of a device to be manufactured; and
 a second module coupled to the first module and configured to receive the first device recipe and tune the device recipe based on a compensation factor to generate a tuned device recipe to control a semiconductor manufacturing tool; and
 a fourth module coupled to the second module and configured to determine an offset based at least in part on a device characteristic.

13. The semiconductor device recipe system of claim 12, wherein the first module and the second module are located within the semiconductor manufacturing tool.

14. The semiconductor device recipe system of claim 12, wherein the first module and the second module are located outside of the semiconductor manufacturing tool.

15. The semiconductor device recipe system of claim 12, further comprising a third module coupled to the second module and configured to receive the tuned device recipe and control the semiconductor manufacturing tool based on the tuned device recipe.

16. The semiconductor device recipe system of claim 12, further comprising a look-up table, wherein the look-up table comprises a sensitivity table.

17. The semiconductor device recipe system of claim 16, further comprising a third module coupled to the second module and configured to translate the sensitivity table to a compensation factor and forward the compensation factor to the second module.

18. The system of claim 1, wherein the device offset is a saturation current offset.

19. The semiconductor manufacturing system of claim 6, wherein the device variable offset is a saturation current offset.

20. The semiconductor device recipe system of claim 12, wherein the device characteristic is a saturation current.

* * * * *